(12) United States Patent
Kamikawa et al.

(10) Patent No.: US 8,030,110 B2
(45) Date of Patent: *Oct. 4, 2011

(54) NITRIDE SEMICONDUCTOR LIGHT-EMITTING DEVICE AND METHOD FOR FABRICATION THEREOF

(75) Inventors: Takeshi Kamikawa, Mihara (JP); Eiji Yamada, Mihara (JP); Masahiro Araki, Mihara (JP); Yoshika Kaneko, Funabashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/979,059

(22) Filed: Dec. 27, 2010

(65) Prior Publication Data
US 2011/0136276 A1     Jun. 9, 2011

Related U.S. Application Data

(62) Division of application No. 10/902,481, filed on Jul. 30, 2004, now Pat. No. 7,903,708.

(30) Foreign Application Priority Data

Jul. 31, 2003  (JP) .................................. 2003-204262
Jun. 22, 2004  (JP) .................................. 2004-183163

(51) Int. Cl.
  *H01L 21/00*     (2006.01)
(52) U.S. Cl. ................ 438/47; 438/42; 438/43; 438/44; 438/46; 257/12; 257/13; 257/14; 257/15; 257/79; 257/94; 257/95; 257/99; 257/109; 257/190; 257/200; 257/201; 257/618; 257/E21.108; 257/E33.001; 257/E33.002; 257/E33.005; 257/E33.013; 257/E33.033; 257/E33.043; 313/506

(58) Field of Classification Search ............... 372/43.01, 372/50.1, 45.01; 257/12–15, 79, 94, 95, 257/99, 103, 183, 190, 200, 201, 618, E21.108, 257/E33.001, E33.002, E33.005, E33.013, 257/E33.033, E33.043; 438/22, 29, 42–44, 438/46, 47; 313/506
See application file for complete search history.

(56) References Cited

U.S. PATENT DOCUMENTS 5,500,389 A * 3/1996 Lee et al. ..................... 438/492
(Continued)

FOREIGN PATENT DOCUMENTS

CN           1295365           5/2001
(Continued)

OTHER PUBLICATIONS

Nakamura, S. et al.(1998) "InGaN/GaN/AlGaN-based laser diodes with cleaved facets grown on GaN substrates," *Applied Physics Letter*, 73(6), 832-834.

(Continued)

*Primary Examiner* — Hrayr Sayadian
(74) *Attorney, Agent, or Firm* — Morrison & Foerster LLP

(57) ABSTRACT

A nitride semiconductor laser device uses a substrate with low defect density, contains reduced strains inside a nitride semiconductor film, and thus offers a satisfactorily long useful life. On a GaN substrate (10) with a defect density as low as $10^6$ cm$^{-2}$ or less, a stripe-shaped depressed portion (16) is formed by etching. On this substrate (10), a nitride semiconductor film (11) is grown, and a laser stripe (12) is formed off the area right above the depressed portion (16). With this structure, the laser stripe (12) is free from strains, and the semiconductor laser device offers a long useful life. Moreover, the nitride semiconductor film (11) develops reduced cracks, resulting in a greatly increased yield rate.

4 Claims, 13 Drawing Sheets

U.S. PATENT DOCUMENTS

| | | | |
|---|---|---|---|
| 6,335,546 B1 * | 1/2002 | Tsuda et al. | 257/94 |
| 6,500,747 B1 * | 12/2002 | Lee et al. | 438/604 |
| 6,821,805 B1 * | 11/2004 | Nakamura et al. | 438/41 |
| 6,984,841 B2 * | 1/2006 | Tsuda et al. | 257/12 |
| 7,015,058 B2 * | 3/2006 | Takatani et al. | 438/41 |
| 7,462,882 B2 * | 12/2008 | Ueta et al. | 257/103 |
| 7,498,608 B2 * | 3/2009 | Ito et al. | 257/98 |
| 7,579,627 B2 * | 8/2009 | Ueta et al. | 257/79 |
| 7,692,200 B2 * | 4/2010 | Kamikawa et al. | 257/79 |
| 7,709,858 B2 * | 5/2010 | Tsuda et al. | 257/103 |
| 7,772,611 B2 * | 8/2010 | Kamikawa et al. | 257/103 |
| 2002/0137249 A1 * | 9/2002 | Ishida et al. | 438/47 |
| 2002/0146912 A1 * | 10/2002 | Miyajima et al. | 438/761 |
| 2003/0037722 A1 * | 2/2003 | Kiyoku et al. | 117/84 |
| 2003/0080345 A1 * | 5/2003 | Motoki et al. | 257/103 |
| 2005/0141577 A1 * | 6/2005 | Ueta et al. | 372/43 |
| 2005/0151153 A1 * | 7/2005 | Kamikawa et al. | 257/103 |
| 2007/0051961 A1 * | 3/2007 | Kamikawa et al. | 257/94 |

FOREIGN PATENT DOCUMENTS

| | | |
|---|---|---|
| JP | 2000-156524 | 6/2000 |
| JP | 2002-319733 | 10/2002 |
| JP | 2003-124573 | 4/2003 |

OTHER PUBLICATIONS

"Above," located at <http://www.merriam-webster.com/dictionary/above> retrieved on Sep. 28, 2008. (2 pages).

Kamikawa et al., U.S. Office Action mailed Sep. 11, 2006, directed to related U.S. Appl. No. 10/902,481; 7 pages.

Kamikawa et al., U.S. Office Action mailed Mar. 16, 2007, directed to related U.S. Appl. No. 10/902,481; 11 pages.

Kamikawa et al., U.S. Office Action mailed Jul. 10, 2007, directed to related U.S. Appl. No. 10/902,481; 5 pages.

Kamikawa et al., U.S. Office Action mailed Aug. 27, 2007, directed to related U.S. Appl. No. 10/902,481; 4 pages.

Kamikawa et al., U.S. Office Action mailed Feb. 28, 2008, directed to related U.S. Appl. No. 10/902,481; 6 pages.

Kamikawa et al., U.S. Office Action mailed Oct. 7, 2008, directed to related U.S. Appl. No. 10/902,481; 6 pages.

Kamikawa et al., U.S. Office Action mailed Jul. 21, 2009, directed to related U.S. Appl. No. 10/902,481; 7 pages.

* cited by examiner

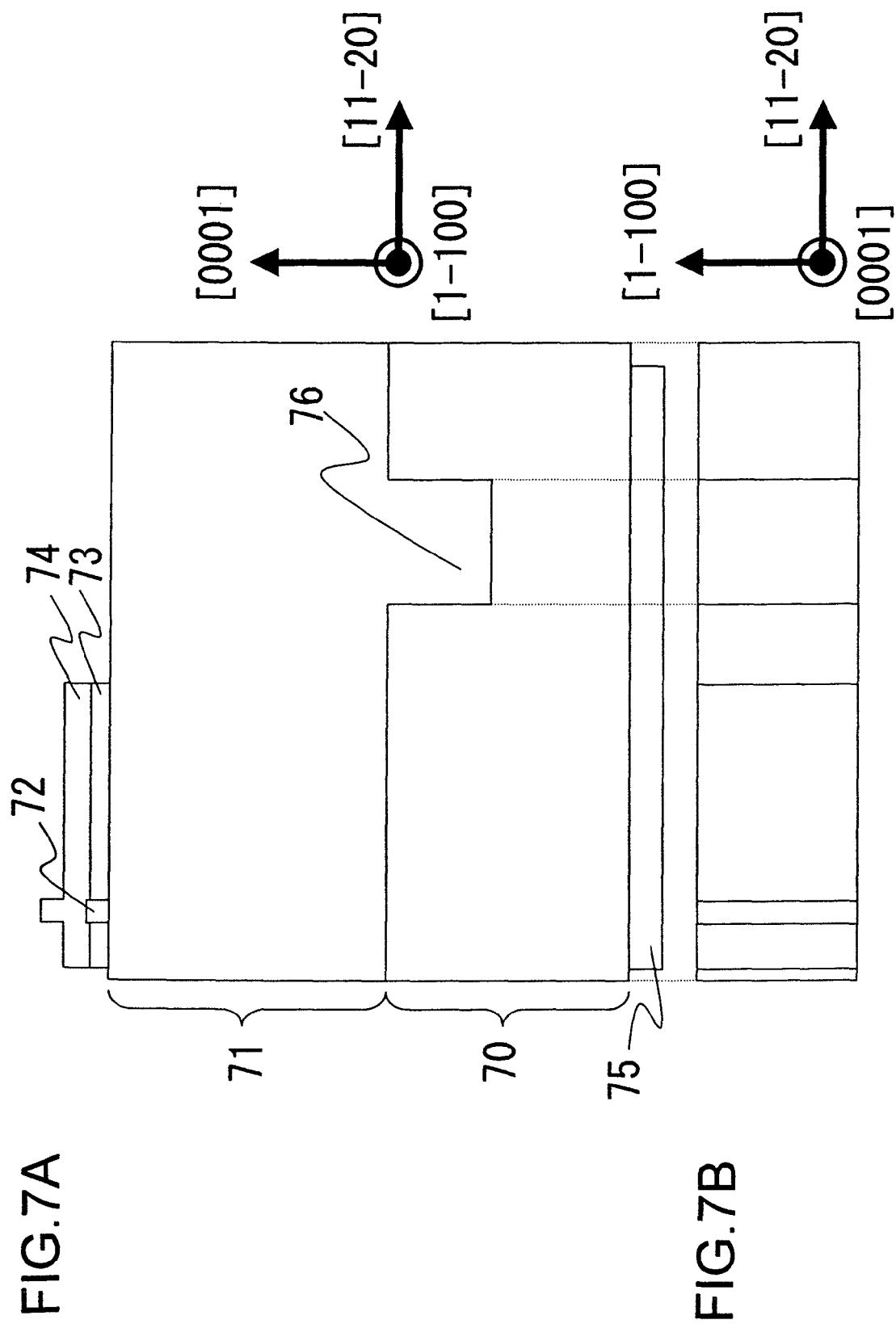

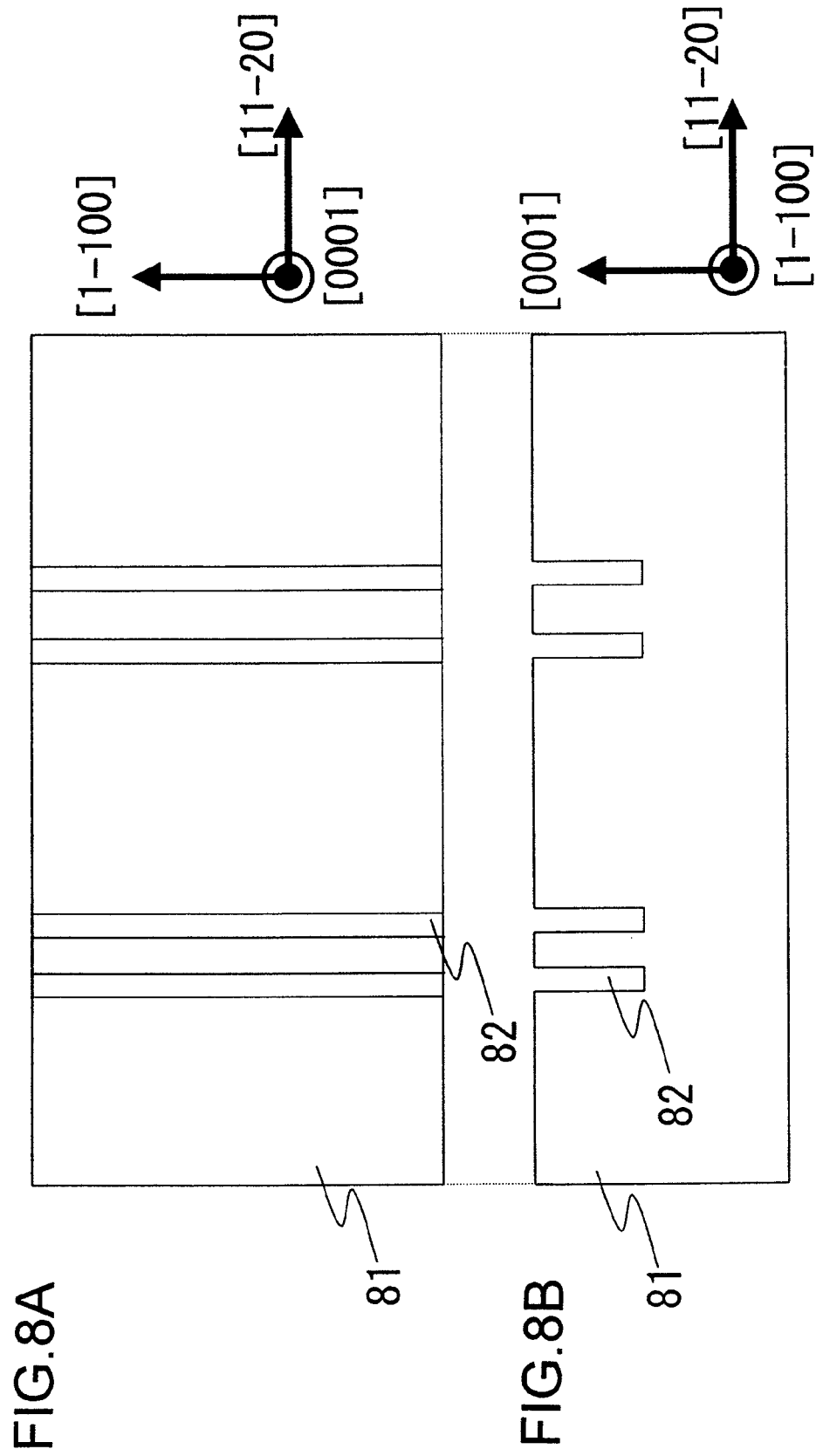

NITRIDE SEMICONDUCTOR LIGHT-EMITTING DEVICE AND METHOD FOR FABRICATION THEREOF

CROSS REFERENCE TO RELATED APPLICATIONS

This application is a divisional of U.S. application Ser. No. 10/902,481, filed Jul. 30, 2004, which claims priority of Japanese Patent Application Nos. 2003-204262, filed Jul. 31, 2003 and 2004-183163, filed Jun. 22, 2004, the contents of which are incorporated herein by reference in their entireties.

BACKGROUND OF THE INVENTION

1. Field of the Invention

The present invention relates to a nitride semiconductor light-emitting device, and to a method for fabricating one. More particularly, the present invention relates to a nitride semiconductor light-emitting device that uses a nitride semiconductor as a substrate thereof.

2. Description of Related Art

There have been fabricated prototypes of semiconductor laser devices that oscillate in a region ranging from ultraviolet to visible light by the use of a nitride semiconductor material as exemplified by GaN, AlN, InN, and composite crystals thereof. For such purposes, GaN substrates are typically used, and therefore GaN substrates have been intensively researched by a host of research-and-development institutions. At the moment, however, no semiconductor laser devices offer satisfactorily long useful lives, and accordingly what is most expected in them is longer useful lives. It is known that the useful life of a semiconductor laser device strongly depends on the density of defects (such as vacancies, interstitial atoms, and dislocations, all disturbing the regularity of a crystal) that are present in a GaN substrate from the beginning. The problem here is that substrates with low defect density, however effective they may be believed to be in achieving longer useful lives, are extremely difficult to obtain, and therefore researches have been eagerly done to achieve as much reduction in defect density as possible.

For example, Applied Physics Letter, Vol. 73 No. 6 (1998), pp. 832-834, reports fabricating a GaN substrate by the following procedure. First, on a sapphire substrate, a 2.0 µm thick primer GaN layer is grown by MOCVD (metalorganic chemical vapor deposition). Then, on top of this, a 0.1 µm thick $SiO_2$ mask pattern having regular stripe-shaped openings is formed. Then, further on top, a 20 µm thick GaN layer is formed again by MOCVD. Now, a wafer is obtained. This technology is called ELOG (epitaxially lateral overgrown), which exploits lateral growth to reduce defects.

Further on top, a 200 µm thick GaN layer is formed by HVPE (hydride vapor phase epitaxy), and then the sapphire substrate serving as a primer layer is removed. In this way, a 150 µm thick GaN substrate is produced. Next, the surface of the obtained GaN substrate is ground to be flat. The thus obtained substrate is known to have a defect density as low as $10^6$ $cm^{-2}$ or less.

It has been found, however, that, even with a semiconductor laser device fabricated by growing, by a growing process such as MOCVD, a nitride semiconductor film on a low-defect substrate, such as the one obtained by the above-described procedure, it is still impossible to obtain a useful life that is satisfactorily long for practical use. Through an intensive study in search of the reason for that, the inventors of the present invention have found out that strains and cracks present inside a nitride semiconductor film greatly affect the deterioration and yield rate of a semiconductor laser device. Even when a GaN substrate that is homoepitaxial with a nitride semiconductor film is used, the grown nitride semiconductor film includes layers of InGaN, AlGaN, and the like whose lattice constants and thermal expansion coefficients differ from those of GaN. The presence of these layers different from GaN causes an InGaN active layer and other layers to receive compressive stress. It has been found that the resulting strains present inside the film accelerate the deterioration of the semiconductor laser device.

Another problem with a nitride semiconductor film is many cracks that develop therein, resulting in a low yield rate. The development of such cracks is also greatly affected by strains present inside the film.

More specifically, when a laser structure formed of a nitride semiconductor thin film is epitaxially grown on a nitride semiconductor substrate, many cracks (for example, several or more within a width of 1 mm) develop, resulting in an extremely low yield rate of devices with the desired characteristics. If a fabricated device contains cracks, the device may be flatly unable to produce laser oscillation at all, or, even if it can, its useful life is extremely short, making the device practically unusable. The development of such cracks is remarkable in a device structure including a layer containing Al, and, since a nitride semiconductor laser device typically includes such a layer, it is very important to eradicate cracks.

SUMMARY OF THE INVENTION

In view of the conventionally encountered problems mentioned above, it is an object of the present invention to provide a nitride semiconductor light-emitting device, such as a nitride semiconductor laser device, that uses a substrate with low defect density, that contains reduced strains inside a nitride semiconductor film, and that thus offers a satisfactorily long useful life. It is another object of the present invention to provide a method for fabricating such a nitride semiconductor light-emitting device with a high yield rate.

To achieve the above objects, in one aspect of the present invention, in a nitride semiconductor laser device including a substrate of which at least a surface is a nitride semiconductor and a nitride semiconductor film laid on top of the surface of the substrate and having a stripe-shaped laser light waveguide structure, the surface of the substrate has a low-defect region with a defect density of $10^6$ $cm^{-2}$ or less and a depressed portion, and the laser light waveguide structure of the nitride semiconductor film is located above the low-defect region and off the depressed portion of the surface of the substrate.

In this nitride semiconductor laser device, a substrate having a depressed portion formed in a surface thereof is used, and a laser light waveguide structure formed in a nitride semiconductor film is located off the area right above the depressed portion of the substrate. When the nitride semiconductor film is grown, in the depressed portion of the substrate, growth progresses from different directions and a defect develops where growth from different directions meets, but, elsewhere, growth progresses regularly, suppressing meeting of growth accompanied by defects. In the area above the low-defect region and off the depressed portion, there are less defects resulting from defects of the substrate, and new defects are also less likely to develop, making presence of strains unlikely. By locating the laser light waveguide structure of the nitride semiconductor film in this strain-free area, it is possible to give the device a long useful life. Moreover, even if cracks develop, their development is limited within an area away from the laser light waveguide structure. This helps achieve an increased yield rate.

Advisably, the depressed portion of the surface of the substrate is stripe-shaped. This makes it possible to suppress, over a wide area, meeting of growth accompanied by defects. Thus, it is possible to locate the stripe-shaped laser light waveguide structure surely in an strain-free area.

Advisably, the depressed portion of the surface of the substrate is given a horizontal cross-sectional area of 30 µm² or more. This helps further reduce strains.

Alternatively, the depressed portion of the surface of the substrate is given a horizontal cross-sectional area of from 5 µm² to 30 µm², both ends inclusive, and the nitride semiconductor film is given a thickness of from 2 µm to 10 µm, both ends inclusive. The smaller the depressed portion of the substrate is, and the thicker the nitride semiconductor film is, the less effectively the depressed portion reduces strains in the nitride semiconductor film. With the cross-sectional area of the depressed portion set within the range defined above, and in addition with the thickness of nitride semiconductor film set within the range defined above, it is possible to satisfactorily reduce strains.

Alternatively, the surface of the substrate has, as the depressed portion, a plurality of depressed portions arranged at intervals of from 50 µm to 2 mm, both ends inclusive. How effectively the depressed portion reduces strains in the nitride semiconductor film depends on the distance from the depressed portion. With the interval at which the plurality of depressed portions are arranged set within the range defined above, it is possible to locate the laser light waveguide structure surely in an strain-free area.

Preferably, the center of the laser light waveguide structure of the nitride semiconductor film is located 5 µm or more away from an edge of the depressed portion of the surface of the substrate. In an area within the nitride semiconductor film close to the area thereof located above the depressed portion, strains may develop under the influence of meeting of growth accompanied by defects. With the laser light waveguide structure located so far away as defined above, it is possible to locate the laser light waveguide structure surely in an strain-free area.

To achieve the above objects, in another aspect of the present invention, a method for fabricating a nitride semiconductor laser device including a substrate of which at least a surface is a nitride semiconductor and a nitride semiconductor film laid on top of the surface of the substrate and having a stripe-shaped laser light waveguide structure includes the steps of: forming a depressed portion on the substrate, which includes on the surface thereof a low-defect region with a defect density of $10^6$ cm$^{-2}$ or less and; and locating the laser light waveguide structure of the nitride semiconductor film above the low-defect region and off the depressed portion of the surface of the substrate.

Here, the substrate having the low-defect region and the depressed portion may be produced by forming, on a first nitride semiconductor having a low-defect region, a layer of a second nitride semiconductor and then removing at least part of the second nitride semiconductor.

To achieve the above objects, in still another aspect of the present invention, in a nitride semiconductor laser device including a substrate of which at least a surface is a nitride semiconductor and a nitride semiconductor film laid on top of the surface of the substrate and having a stripe-shaped laser light waveguide structure, the surface of the substrate has a depressed portion, and the laser light waveguide structure of the nitride semiconductor film is located above a region located off the depressed portion of the surface of the substrate.

Alternatively, in a nitride semiconductor light-emitting device including a substrate of which at least a surface is a nitride semiconductor and a nitride semiconductor film laid on top of the surface of the substrate and having a light-emitting region, the surface of the substrate has a depressed portion, and the light-emitting region of the nitride semiconductor film is located above a region located off the depressed portion of the surface of the substrate.

Here, the depressed portion of the surface of the substrate may be stripe-shaped and formed in a mesh-like pattern.

To achieve the above objects, in a further aspect of the present invention, a method for fabricating a nitride semiconductor light-emitting device including a substrate of which at least a surface is a nitride semiconductor and a nitride semiconductor film laid on top of the surface of the substrate and having a light-emitting region includes the steps of: forming, on the surface of the substrate, a depressed portion; forming, on the surface of the substrate having the depressed portion formed therein, the nitride semiconductor film; and locating the light-emitting region above a region located off the depressed portion of the surface of the substrate.

BRIEF DESCRIPTION OF THE DRAWINGS

FIGS. 7A and 7B are a sectional view and a top view, respectively, schematically showing the nitride semiconductor laser device with the nitride semiconductor film thereof made thicker;

FIGS. 8A and 8B are a top view and a sectional view, respectively, schematically showing another structure of the GaN substrate used in the nitride semiconductor laser device;

DETAILED DESCRIPTION OF THE INVENTION

Figure 1:
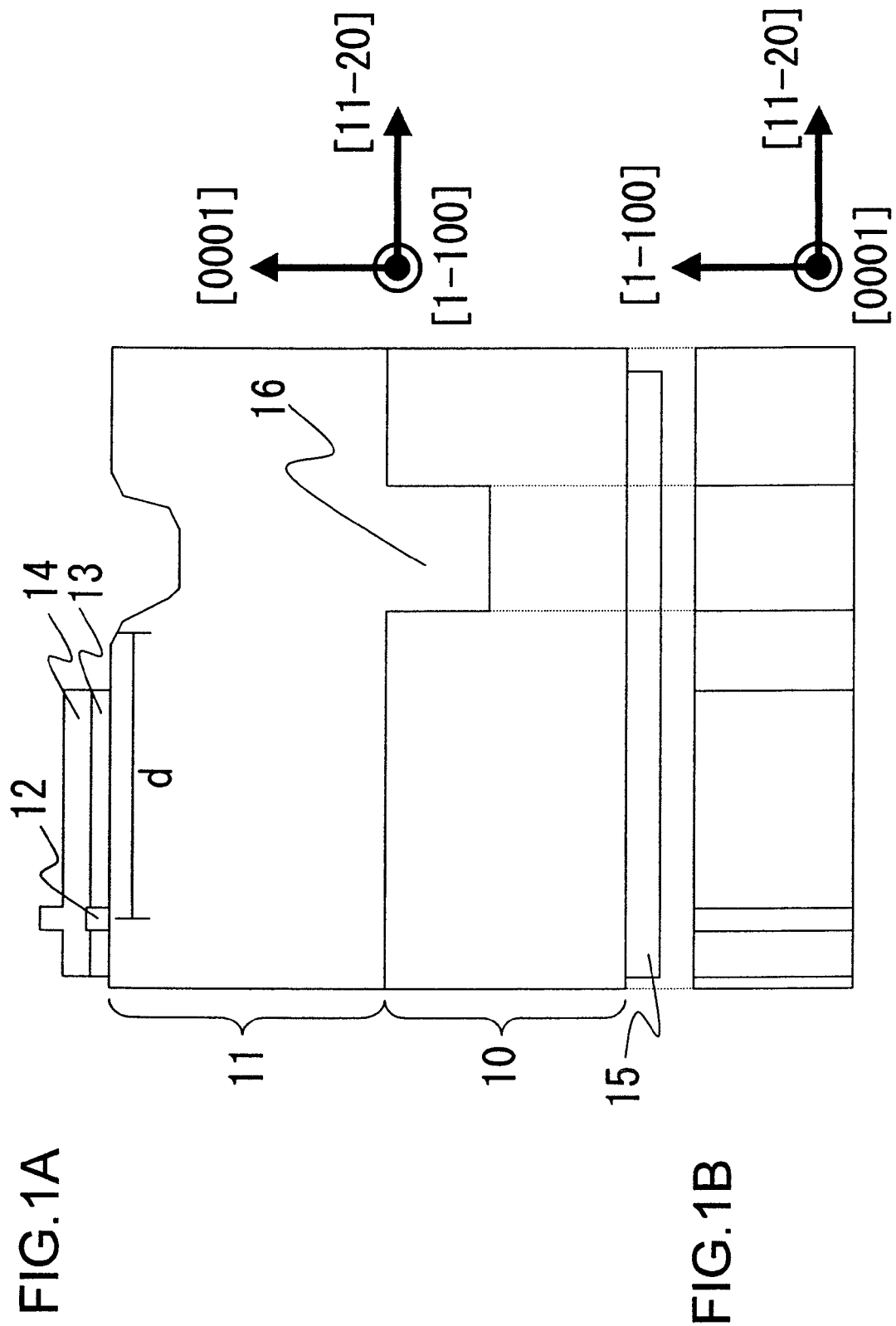
FIGS. 1A and 1B are a sectional view and a top view, respectively, schematically showing the structure of a nitride semiconductor laser device embodying the invention.

Hereinafter, embodiments of the present invention will be described with reference to the accompanying drawings. In the following description, a negative index in a formula indicating a plane or direction of a crystal will be represented by a negative sign "−" followed by the absolute value of the index instead of the absolute value accompanied by an overscore placed thereabove as required by convention in crystallography, simply because the latter notation cannot be adopted in the present specification.

Example of how a Substrate is Produced

Part of the fabrication process of a low-defect GaN substrate (with a defect density of $10^6$ cm$^{-2}$ or less) used in this embodiment can be achieved by the procedure described earlier in connection with the conventional example. Specifically, first, on a sapphire substrate, a 2.5 µm thick primer GaN layer is grown by MOCVD. Then, on top of this, a SiO$_2$ mask pattern having regular stripe-shaped openings (with a period of 20 µm) is formed. Then, further on top, a 15 µm thick GaN layer is formed again by MOCVD. Now, a wafer is obtained.

The film does not grow on SiO$_2$, and thus starts to grow inside the openings. As soon as the film becomes thicker than the SiO$_2$, the film then starts to grow horizontally away from the openings. At the center of every SiO$_2$ segment, different portions of the film growing from opposite sides meet, producing, where they meet, a defect-concentrated region with high defect density. Since the SiO$_2$ is formed in the shape of lines, defect-concentrated regions are also formed in the shape of lines. As described earlier, this technology is called ELOG, which exploits lateral growth to reduce defects.

Further on top, a 600 µm thick GaN layer is formed by HVPE (hydride vapor phase epitaxy), and then the sapphire substrate serving as a primer layer is removed. Next, the surface of the obtained GaN substrate is ground to be flat. In this way, a 400 µm thick GaN substrate is produced.

The substrate thus obtained has the GaN layer grown extremely thick, and thus includes, over almost the entire area thereof, low-defect regions with a defect density of $10^5$ cm$^{-2}$ or less. However, depending on the growth conditions, regions with a defect density higher than $10^5$ cm$^{-2}$ may be formed in the shape of stripes on the surface of the obtained substrate in such a way as to correspond to the defect-concentrated regions mentioned above. It should be noted that, also during growth by HVPE, by forming a SiO$_2$ mask above the defect-concentrated regions, it is possible to more effectively reduce defects on the surface of the substrate.

Here, the substrate is produced by ELOG. It should be understood, however, that how the substrate is produced does not affect in any way the nature and effects of the present invention. Specifically, the only requirement is to use a nitride semiconductor substrate having a low-defect region on the surface thereof.

The dislocation density can be evaluated by one of the following and other methods. One way is by subjecting the substrate to etching by dipping it in a mixed acid liquid, namely a mixture of sulfuric acid and phosphoric acid, heated to 250° C. and then counting the EPD (etch pit density) within a 50 µm×50 µm region. Another way is by counting the dislocation density in an image obtained by using a transmission electron microscope.

The measurement of the EPD can be made possible by the use of gas-phase etching such as RIE. Alternatively, suspension of growth in a MOCVD furnace followed by exposure to a high temperature (about 1,000° C.) also makes the measurement of the EPD possible. The measurement itself can be achieved by the use of an AFM (atomic force microscope), CL (cathode luminescence), microscopic PL (photo luminescence), or the like.

It should be noted that a substrate with low defect density denotes not only a substrate having low-defect regions distributed all over the area thereof but also a substrate including low-defect regions in only a portion of the surface thereof. The low-defect regions may be distributed in any manner, but the laser stripes of semiconductor lasers need to be so formed as to include those low-defect regions.

Forming a Semiconductor Laser Device

By the procedure described earlier or the like, a GaN substrate including low-defect regions is obtained. In this embodiment, the substrate is assumed to have a defect density of about $10^6$ cm$^{-2}$ or less over the entire area thereof. Next, all over the surface of this substrate, SiO$_2$ or the like is vapor-deposited so as to have a thickness of 1 µm by sputtering. Then, by common photolithography; stripe-shaped windows are formed with photoresist so as to have a width of 40 µm each and a period of 400 µm in the [1-100] direction. Then, by ICP or RIE (reactive ion etching), the SiO$_2$ and the GaN substrate are etched. The GaN substrate is etched to a depth of 6 µm. Thereafter, the SiO$_2$ is removed with an etchant such as HF. This is the end of the treatment of the substrate to be performed before a nitride semiconductor film is grown thereon.

Figure 2:
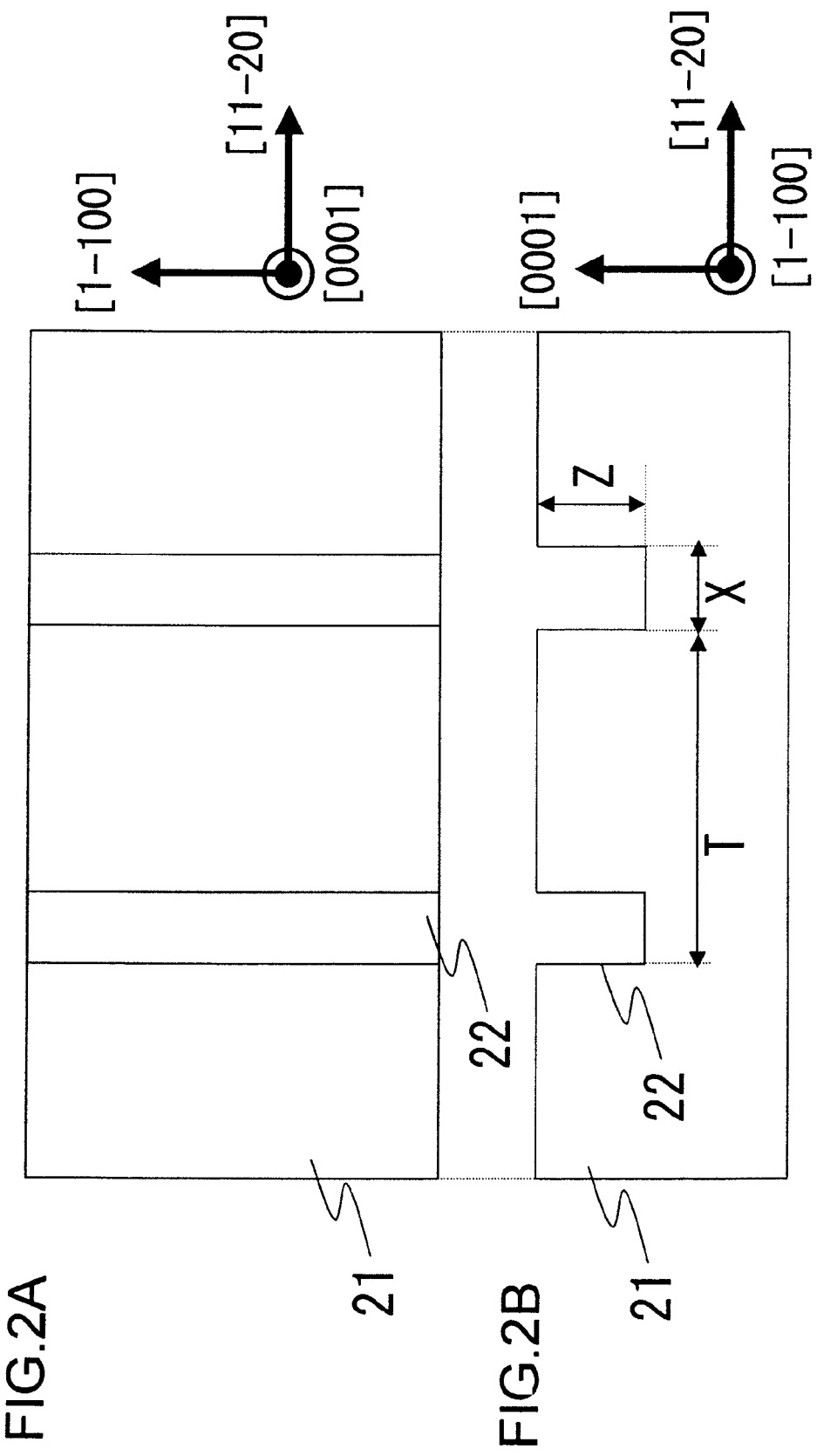
FIGS. 2A and 2B are a top view and a sectional view, respectively, schematically showing the structure of the GaN substrate used in the nitride semiconductor laser device.

FIGS. 2A and 2B show the thus obtained substrate, in a top view and a sectional view, respectively. Reference numeral 21 represents the GaN substrate, and reference numeral 22 represents the regions etched by RIE. Symbols X, Z, and T represent the etching width, depth, and period, respectively. The etching may be achieved by the use of gas-phase etching, or by the use of a liquid etchant. In the following descriptions, the regions 22 of the substrate depressed as a result of being removed by etching will be referred to also as the carved regions. The carved regions may be formed after once the thin film of GaN, InGaN, AlGaN, InAlGaN, and the like has been grown on the GaN substrate including low-defect regions. That is, the present invention includes structures wherein a nitride semiconductor film is grown by first growing it and then forming carved regions.

Figure 9A:
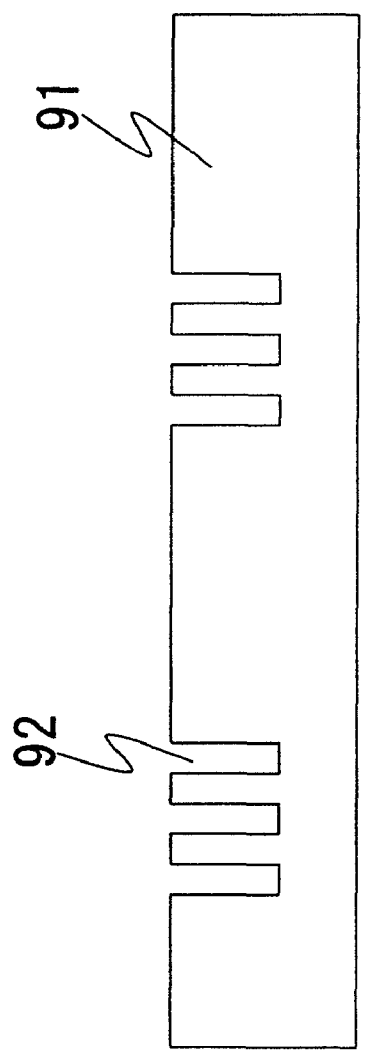
FIGS. 9A to 9C are sectional views each schematically showing a different pattern of the carved regions formed in the GaN substrate.
Figure 9B:
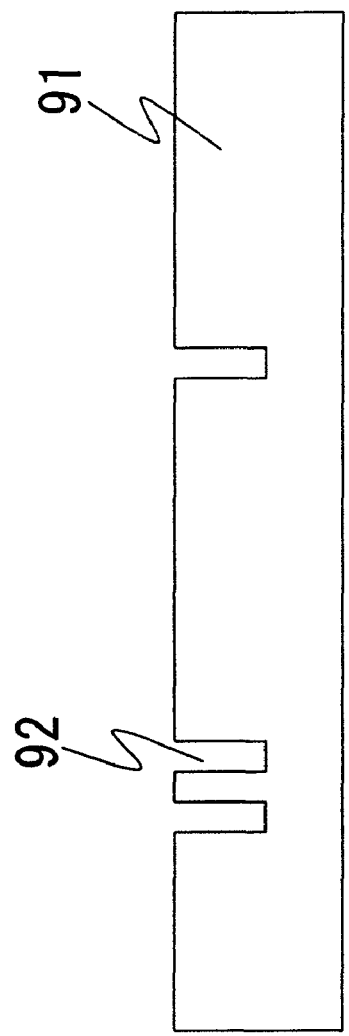
Figure 9C:
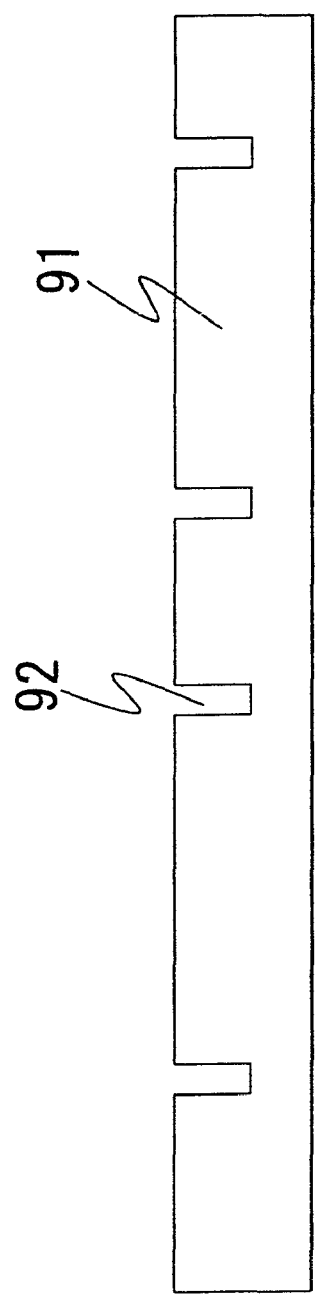

The carved regions may be arranged in one of various patterns. For example, as shown in FIGS. 8A and 8B, two carved regions may be formed at a predetermined interval; or, as shown in FIGS. 9A to 9C, more than two carved regions may be formed, or carved regions may be formed with different periods used mixedly, or carved regions may be formed in a mixed pattern including singly and doubly arranged carved regions. The present invention is applicable as it is so long as the cross-sectional area and period of one carved region is within the ranges defined in the appended claims. In cases where different periods are used mixedly, each of those mixedly used periods needs to be within the range defined in the appended claims. Here, reference numerals 81 and 91 represent the GaN substrate, and reference numerals 82 and 92 represent the carved regions.

In FIGS. 1A, 1B, 2A, 2B, 5, 7A, 7B, 8A, and 8B, the carved regions are formed parallel to the [1-100] direction. It is, however, also possible to form them in another direction, for example parallel to the [11-20] direction. Basically, the effects of the present invention do not depend on the direction of carving, and therefore the carved regions may be formed in any direction.

The substrate used may include a region with high defect density. This, however, may lead to degraded surface morphology during epitaxial growth, and therefore it is preferable to use a substrate including no region with high defect density.

Figure 4:
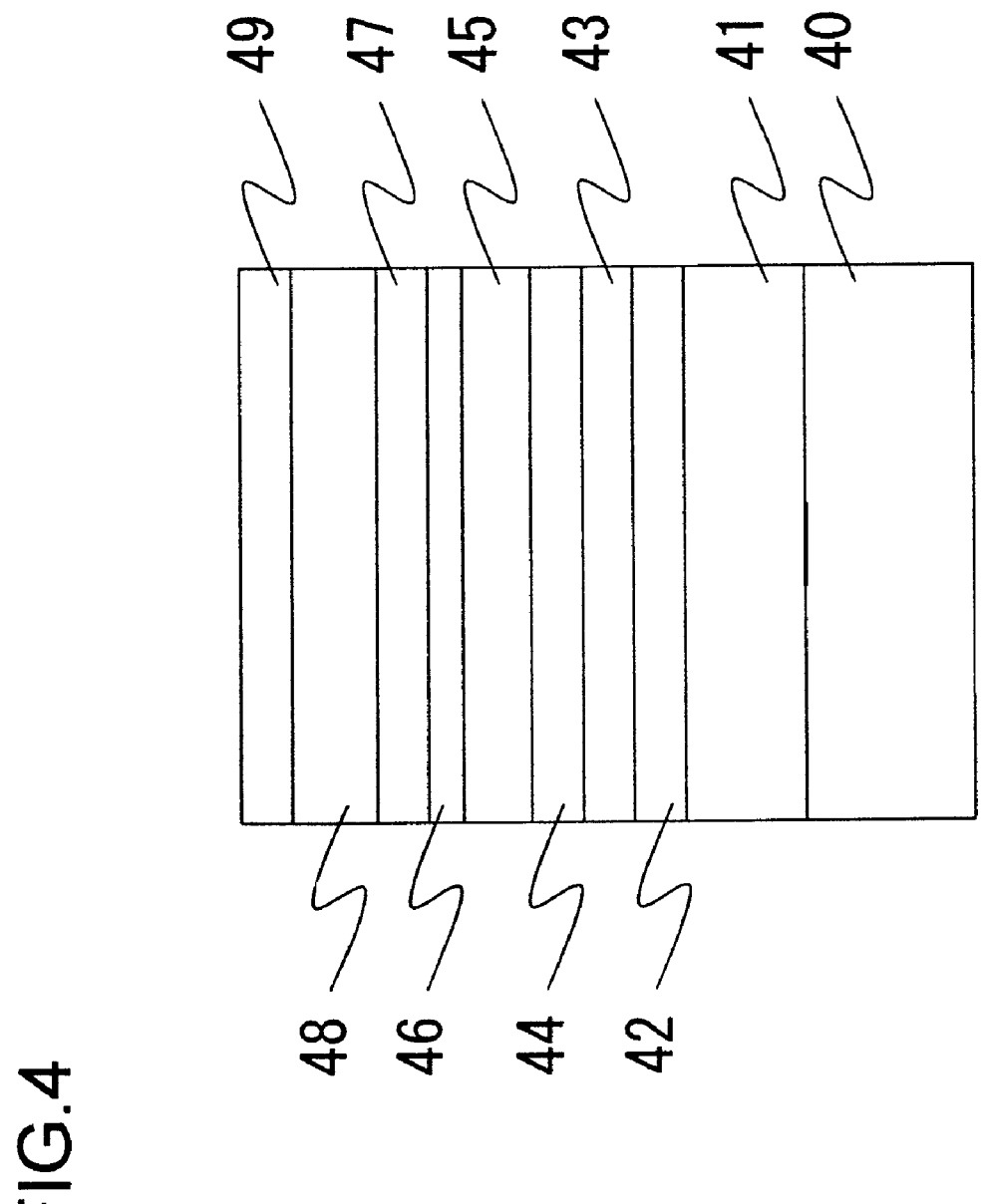
FIG. 4 is a sectional view schematically showing the layer structure of the nitride semiconductor film of the nitride semiconductor laser device.

On this substrate, the nitride semiconductor film shown in FIG. 4 is grown, and thereby the nitride semiconductor laser device of this embodiment is obtained. FIGS. 1A and 1B schematically show the structure of the thus obtained semiconductor laser device. FIG. 1A is a sectional view of the semiconductor laser device as seen from the direction in which it emits light, and FIG. 1B is a top view of the semiconductor laser device as seen from above.

Here, reference numeral 10 represents the GaN substrate, and, in this substrate 10, low-defect regions are present. FIG. 4 shows the following. On an n-type GaN layer (1.0 μm) 40, there are laid the following layers one on top of another in the order mentioned: an n-type $Al_{0.062}Ga_{0.938}N$ first clad layer (1.5 μm) 41, an n-type $Al_{0.1}Ga_{0.9}N$ second clad layer (0.2 μm) 42, an n-type $Al_{0.062}Ga_{0.938}N$ third clad layer (0.1 μm) 43, an n-type GaN guide layer (0.1 μm) 44, an InGaN/GaN-3MQW active layer (InGaN/GaN=4 nm/8 nm) 45, a p-type $Al_{0.3}Ga_{0.7}N$ evaporation prevention layer (20 nm) 46, a p-type GaN guide layer (0.05 μm) 47, a p-type $Al_{0.062}Ga_{0.938}N$ clad layer (0.5 μm) 48, and a p-type GaN contact layer (0.1 μm) 49.

On top of the substrate 10, a nitride semiconductor film (epitaxially grown layer) 11 is formed that has the same structure as the nitride semiconductor thin film shown in FIG. 4. Moreover, on the top surface of the nitride semiconductor film 11, a laser stripe 12 is formed as a laser light waveguide structure. This laser stripe 12 needs to be formed so as to be located above a low-defect region included in the substrate. The substrate used in this embodiment has low-defect regions all over the area thereof, and therefore the laser stripe may be formed anywhere thereon except above carved regions. The reason will be described later.

On the top surface of the nitride semiconductor film 11 is formed $SiO_2$ 13 for current narrowing, and on the top surface of this is formed a p-type electrode 14. On the other hand, on the bottom surface of the substrate 10 is formed an n-type electrode 15. Reference numeral 16 represents a carved region. The top surface of the portion of the nitride semiconductor film 11 located above the carved region 16 is depressed under the influence of the carved region 16.

Whether the top surface of the portion located above the carved region 16 is depressed or not depends on the thickness of the nitride semiconductor film. FIG. 7 schematically shows the structure obtained when the top surface of the portion located above the carved region is flat. In FIG. 7, reference numeral 70 represents the GaN substrate, reference numeral 71 represents the nitride semiconductor film, reference numeral 72 represents the laser stripe, reference numeral 73 represents $SiO_2$ for current narrowing, reference numeral 74 represents the p-type electrode, reference numeral 75 represents the n-type electrode, and reference numeral 76 represents the carved region. In this way, as the nitride semiconductor film is made thicker, the top surface of the portion located above the carved region 76 becomes flatter. It should be noted that, in the present invention, whether the top surface of the portion located above the carved region is depressed or flat does not matter.

Figure 5:
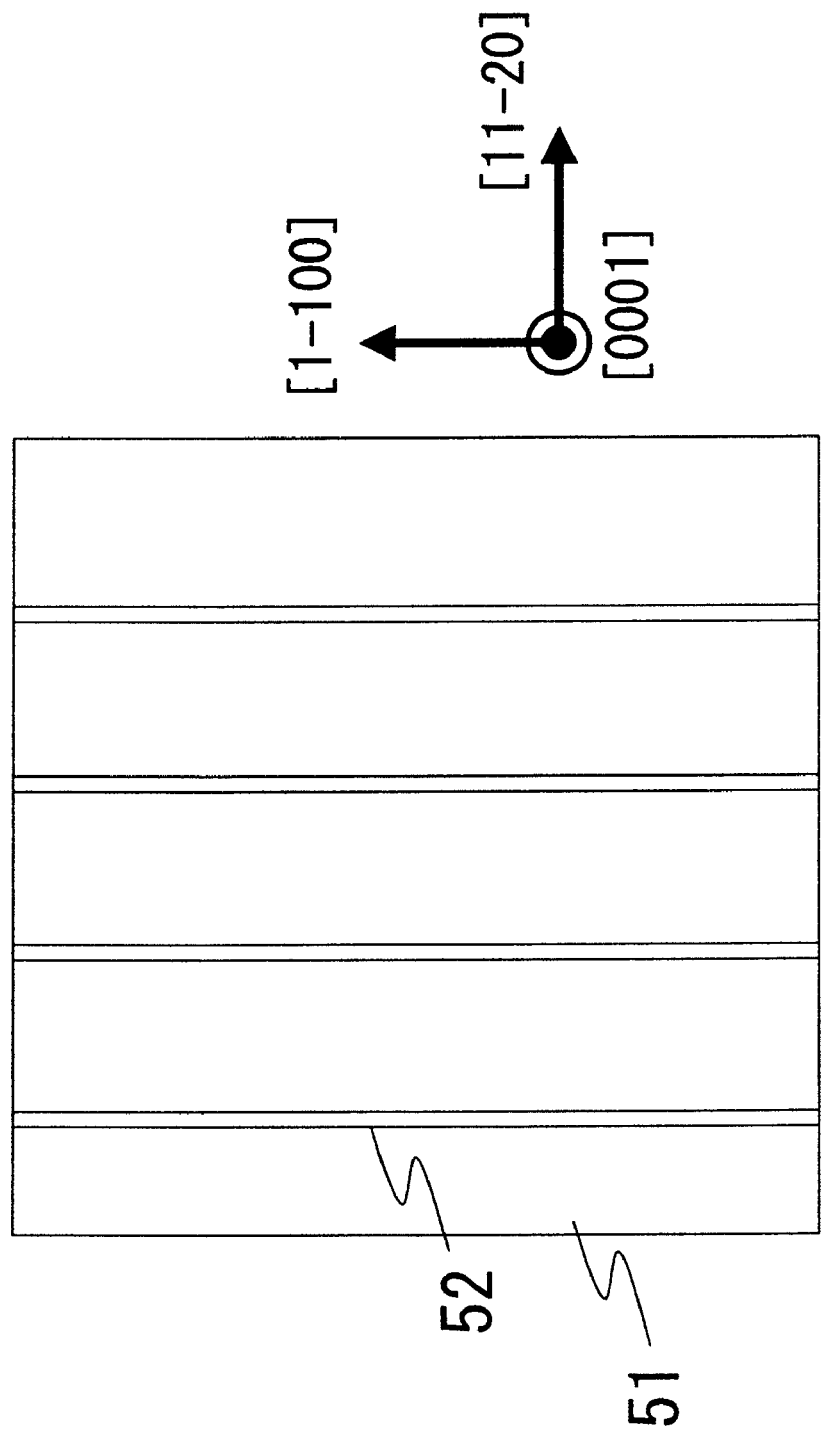
FIG. 5 is a top view schematically showing the wafer having a nitride semiconductor grown on the GaN substrate used in the nitride semiconductor laser device.

In FIG. 1A, the distance from the center of the laser stripe 12 to the edge of the carved region 16 is represented by "d", and specifically d=40 μm here. FIG. 5 schematically shows a top view of the wafer before it is diced into individual semiconductor laser devices. In this embodiment, it was possible to obtain a nitride semiconductor film 51 completely free from cracks all over the area thereof. In FIG. 5, reference numeral 52 represents the carved regions.

The wafer can be diced into individual nitride semiconductor laser devices by a common dicing process. No description will be given of this dicing process. No cracks were observed in the nitride semiconductor laser devices after the separation of the wafer into individual chips. As a result, the laser devices oscillated with stable characteristics, and the yield rate of the semiconductor laser devices of this embodiment which offered the desired oscillation characteristics (i.e., those requiring a drive current Iop of 70 mA or less when producing an optical output of 30 mW) was more than 90%.

The useful lives of the diced semiconductor laser devices were tested with the devices driven under APC (automatic power control) at 60° C. and at an output of 30 mW. In the test, the devices emitted at wavelengths of 405±5 nm. From each wafer, 50 semiconductor laser devices that fulfilled predetermined initial characteristics were randomly picked out, and the number of devices of which the useful lives exceeded 3,000 hours was counted as the yield rate. Here, the yield rate of the semiconductor laser device of this embodiment was more than 85%.

Comparative Example 1 of a Semiconductor Laser Device

Now, with reference to FIG. 3, a description will be given of what happened when, without any extra treatment performed, a nitride semiconductor film was grown on a substrate including low-defect regions in the surface thereof. Reference numeral 31 represents a wafer produced by growing, by MOCVD, a nitride semiconductor thin film as shown in FIG. 4 on a substrate including low-defect-density regions. Reference numeral 32 represents cracks that developed in the wafer.

Figure 3:
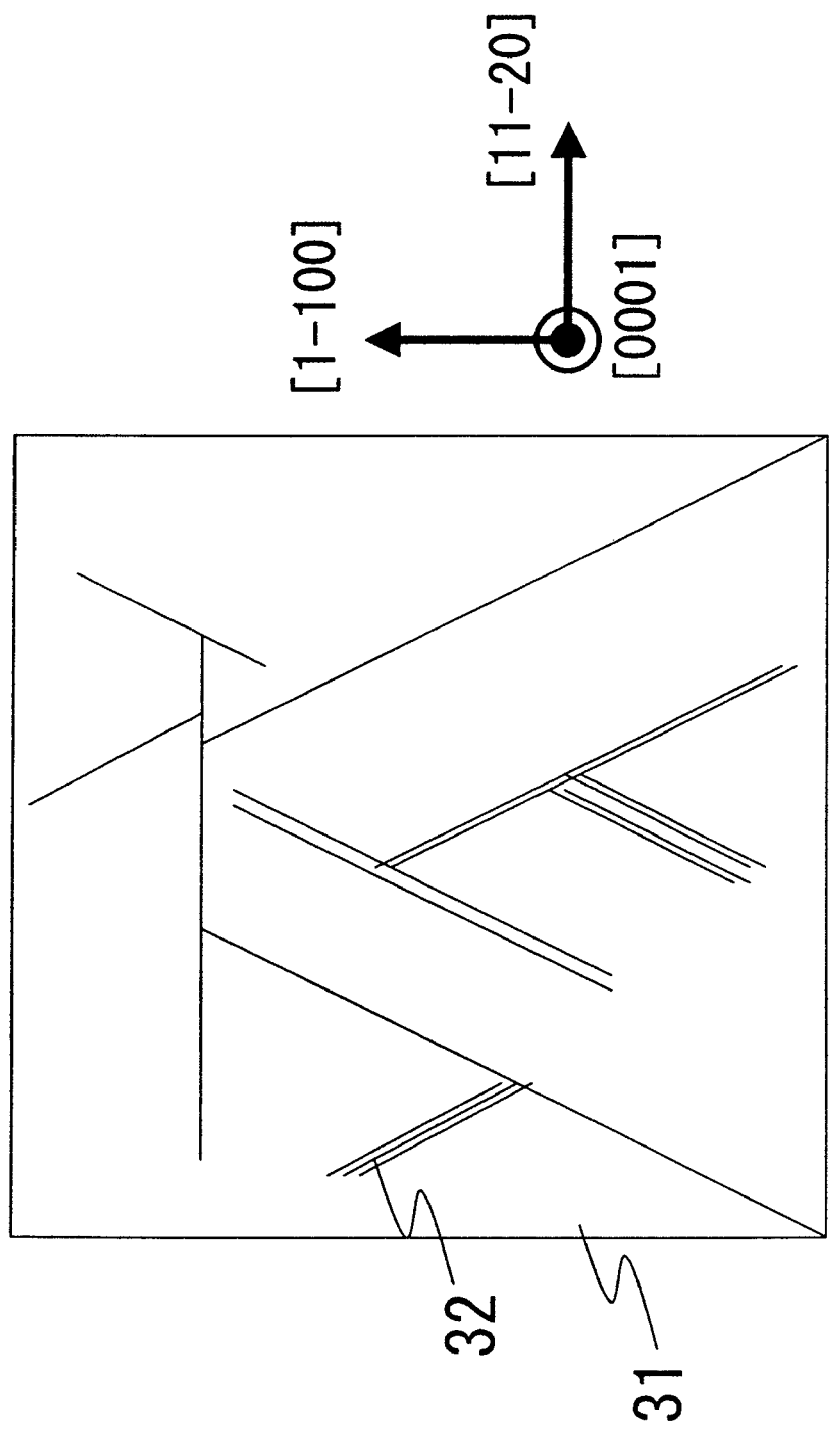
FIG. 3 is a top view schematically showing the wafer having a nitride semiconductor grown on a conventional GaN substrate.

When a nitride semiconductor film was grown on a substrate including low-defect regions as it is (i.e., if no carved regions were formed thereon), as shown in FIG. 3, many cracks developed in the wafer. The result of counting the number of cracks that crossed a 1 mm×1 mm region on the wafer was about three to ten. If a fabricated device contains cracks, the device may be flatly unable to produce laser oscillation at all, or, even if it can, its useful life is extremely short, making the device practically unusable. For this reason, the yield rate of devices that produced the desired laser oscillation was extremely low, specifically 50% or less. The development of such cracks is remarkable in a device structure including a layer containing Al, and, since a nitride semiconductor laser device typically includes such a layer, it is very important to eradicate cracks.

Moreover, when semiconductor laser devices were fabricated in portions of the wafer where no cracks happened to develop and their useful lives were tested at 60° C. and at 30 mW, the yield rate of devices with a useful life of 3,000 hours or more was as poor as about 15%. One cause for this is considered to be minute cracks that are present in the wafer but that cannot be observed from the surface of the wafer. Here, the useful life is defined as the length of time required for the drive current Iop to become 1.5 times the initial level thereof while the output is kept at 30 mW.

The embodiment under discussion aims to obtain a long useful life by reducing cracks, increasing the yield rate of semiconductor laser devices, and controlling the strains that develop therein. Now, the embodiment will be described in detail.

Comparative Example 2 of a Semiconductor Laser Device

Another comparative example of a semiconductor laser device was fabricated in which a laser stripe was formed above a carved region. Except for the position of the laser stripe, this semiconductor laser device has the same structure as that of the embodiment under discussion. The useful lives of semiconductor laser devices diced out of a wafer having a structure wherein laser stripes were formed right above carved regions 16. In this test, the yield rate was 35% or less.

The lessening of the yield rate here is believed to result from severer strains contained in the semiconductor laser devices. The fact that, when no carved regions were formed in the substrate, many cracks developed is considered to suggest the presence of considerably severe strains.

In the portion above a carved region, the film grows horizontally from the noncarved portions contiguous therewith, and thus the film runs into the carved portion. At this time, pressure acts from both sides on the portion above the carved region, and this is considered to cause this portion to contain severer strains than noncarved regions. Moreover, the carved region has walls at both sides, and therefore the growth that tends to advance to both sides is hampered by the walls. This also results in contained strains. Growth in the carved region is complicated; specifically, growth advances from different directions (normal growth that advances from the bottom surface of the carved region, growth that advances from the side faces of the carved region, growth resulting from running-in from noncarved regions, etc.). Thus, not only does the severity of strains vary within a region, the direction of strains also differs from one place to another, resulting in poor repeatability and thus instability. This is considered to be the cause of the lessening of the yield rate.

Moreover, since growth advances from different directions, many dislocations, defects, and the like develop where growth from different directions meets. Accordingly, when laser stripes are formed above carved regions, such dislocations, defects, and the like promote deterioration, making it impossible to obtain long useful lives.

On the other hand, a noncarved region, when growing, runs into carved regions, and can thereby release strains. This releasing of strains suppresses development of cracks, and simultaneously releases the strains contained in the noncarved region. This releasing of strains occurs with good repeatability and with stability. Moreover, as opposed to the portion above a carved region, growth does not advance from different directions. This helps produce a satisfactorily crystalline film free from dislocations, defects, and the like. These are believed to be the reasons that forming laser stripes in noncarved regions increases the reliability of semiconductor laser devices and prolong the useful lives thereof.

In this embodiment, by forming carved regions 16 and forming laser stripes 12 elsewhere than right above the carved regions 16, it is possible to greatly increase the reliability of LD devices, to suppress the development of cracks, and to dramatically improve the yield rate.

Study on the Carving Conditions and the Layer Thickness

Moreover, the inventors of the present invention have found out that the yield rate correlates with the carving width X (see FIG. 2B) of the carved regions, the carving depth Z thereof, and the total film thickness of the nitride semiconductor film grown on the substrate. The total film thickness of the nitride semiconductor film is the total thickness of all the layers thereof including from the n-type GaN layer 40 through the p-type GaN contact layer 49 shown in FIG. 4.

Figure 6:
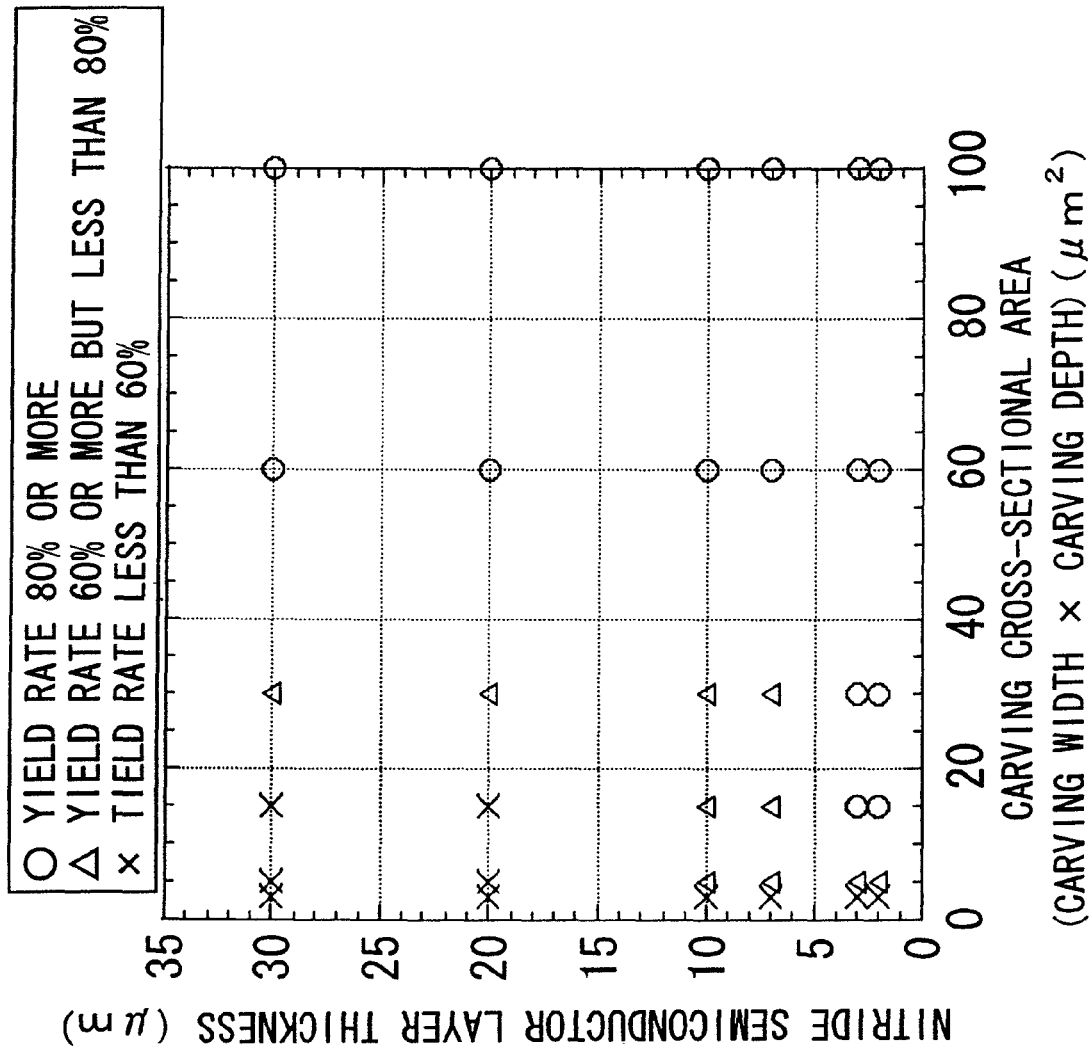
FIG. 6 is a diagram showing the correlation between the depression cross-sectional area, the nitride semiconductor film thickness, and the useful life test yield rate.

Here, the total film thickness was adjusted so as to be varied from 2 µm to 30 µm. FIG. 6 shows the results of plotting the yield rate measured by the useful life test described above against different combinations of the carving cross-sectional area, i.e., the carving depth Z (in µm) multiplied by the carving width X (in µm), and the total film thickness of the nitride semiconductor film grown on top thereof. The period T (see FIG. 2B) of the carved regions was 400 µm.

The regions in which the yield rate was found to be high by the useful life test indicate that, there, the development of cracks was effectively suppressed and the strains in noncarved regions (where ridges are formed) were effectively released. With the carving width X=10 µm and the carving depth Z=5 µm, the carving cross-sectional area equals 5×10=50 µm². The carving width X was varied in the range from the 3 µm to 200 µm, and the carving depth Z was varied in the range from 0.5 µm to 30 µm.

As shown in FIG. 6, when the carving cross-sectional area was 30 µm² or more, it was possible to obtain high yield rates irrespective of the total film thickness of the nitride semiconductor film grown on the substrate. This is considered to be because the strains in noncarved regions were effectively and stably released. Although FIG. 6 only covers up to a cross-sectional area of 100 µm², it was in fact possible to obtain yield rates of 80% or more up to a cross-sectional area of 2,000 µm² in the above film thickness range.

When the carving cross-sectional area was in the range from 5 µm² to 30 µm², so long as the total film thickness of the nitride semiconductor film grown on the substrate was 10 µm or less, it was possible to obtain improved yield rates. When the carving cross-sectional area was less than 5 µm², no improvement was obtained if the total film thickness of the nitride semiconductor film was in the range from 2 µm to 30 µm. This is considered to be because the carving cross-sectional area was so small that the strains in noncarved regions were not released effectively.

FIG. 6 shows the results obtained when the period T of the carved regions was 400 µm. Similar tests were conducted with varying periods T. The period T was varied in the range from 50 µm to 2 mm. The carving width X was varied in the range up to one-half of the period T. For example, when the period T was 50 µm, the carving width X was varied in the range from 0 to 25 µm.

When the period T was in the range from 50 µM to 2 mm, a tendency approximately identical with that shown in FIG. 6 was observed. Specifically, as shown in FIG. 6, when the carving cross-sectional area was 30 µm² or more, it was possible to obtain high yield rates irrespective of the total film thickness of the nitride semiconductor film grown on the substrate; when the carving cross-sectional area was in the range from 5 µm² to 30 µm², so long as the total film thickness of the nitride semiconductor film grown on the substrate was 10 µm or less, it was possible to obtain improved yield rates; when the carving cross-sectional area was less than 5 µm², no improvement was obtained if the total film thickness of the nitride semiconductor film was in the range from 2 µm to 30 µm.

Study on the Position of the Stripe

With respect to where to form ridges, forming them at a distance of 5 µm or less from the edges of carved regions 16 resulted in greatly shortened useful lives in the useful life test. This is considered to be because severe strains were present around carved regions. Accordingly, laser stripes need to be formed 5 µm or more away from the edges of carved regions. Moreover, the position of laser stripes needs to be so determined that they are formed not only in regions with mild strains but in regions with high flatness.

Figure 10:
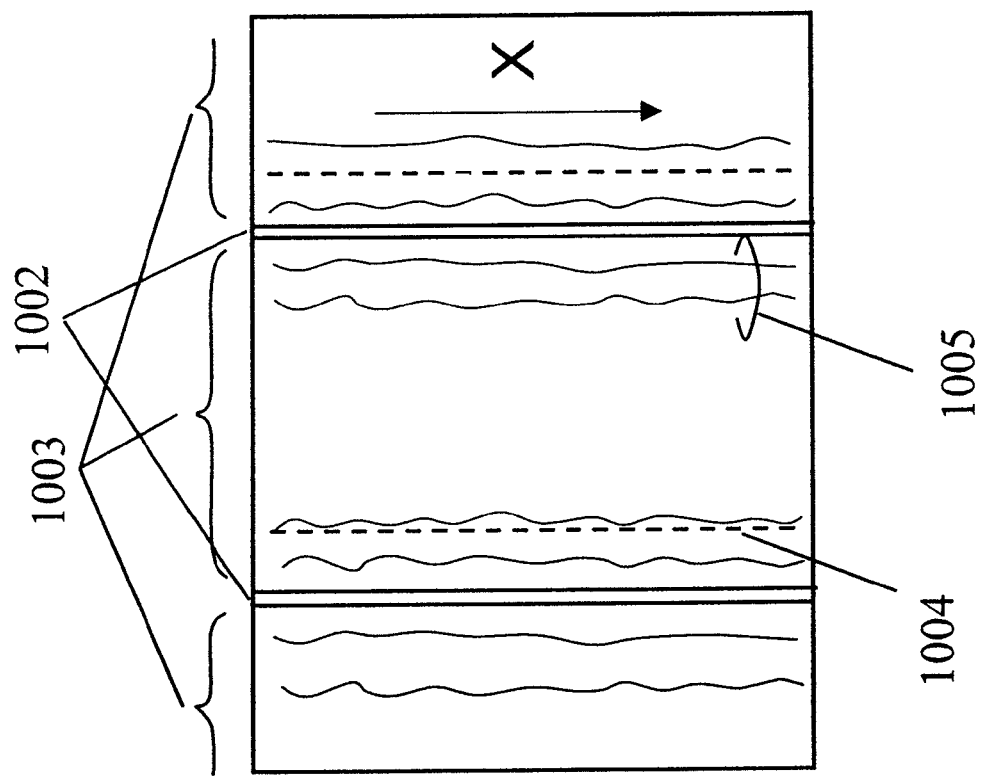
FIG. 10 is a top view showing the surface morphology of the GaN substrate.

A substrate including carved regions suffers from variations in the thickness of the epitaxially grown layer which are observed around the carved regions. FIG. 10 is a diagram illustrating this situation, and shows the state of a wafer 1001 produced by epitaxially growing, by MOCVD, a plurality of nitride semiconductor layers (for example, with a total film thickness of 5 µm) on a GaN substrate having carved regions 1002 formed thereon so as to be parallel to one another. In the regions between the grooves, there are formed semiconductor laser waveguide stripes 1004 (of which the position is indicated by broken lines).

It is inevitable that, under the influence of the grooves, the film thickness of the grown layer varies according to the distance from the grooves. In reality, however, evaluating the layer thickness even at a fixed distance from a groove along the direction of the grooves reveals variations in the layer thickness. Moreover, when the surface of the wafer is inspected under an optical microscope, wave-like morphology 1005 is observed as schematically shown in the figure.

This is considered to be because how the crystal grows in the regions 1003 between the carved regions is sensitively influenced by the grooves. If laser waveguide stripes are formed in such regions, variations in the film thickness along the wave guides not only adversely affect the laser characteristics but also make the characteristics of individual devices uneven.

By contrast, in regions 30 μm or more away from the edges of the carved regions, the above-described variations in the film thickness of the grown layer rapidly diminish, making wave-like surface morphology as shown in FIG. 10 unobservable.

Figure 11:
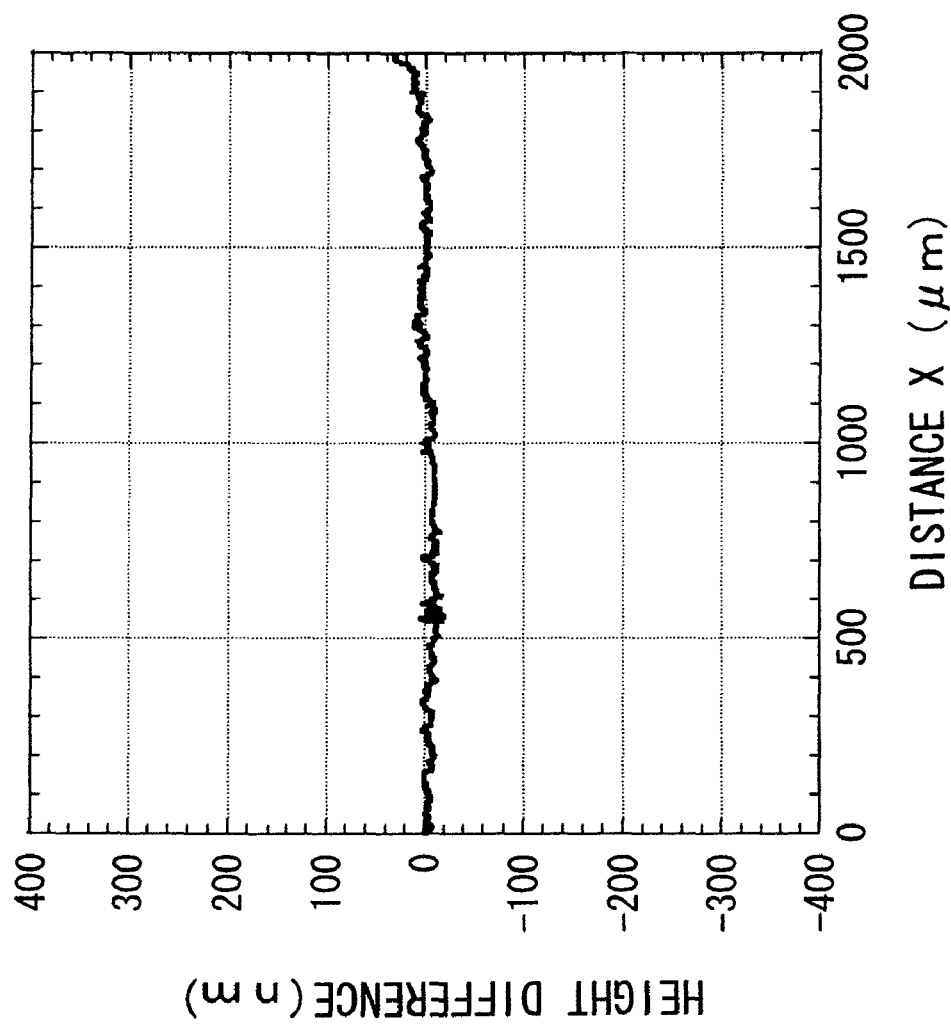
FIG. 11 is a diagram showing height variations on the surface of the nitride semiconductor.
Figure 12:
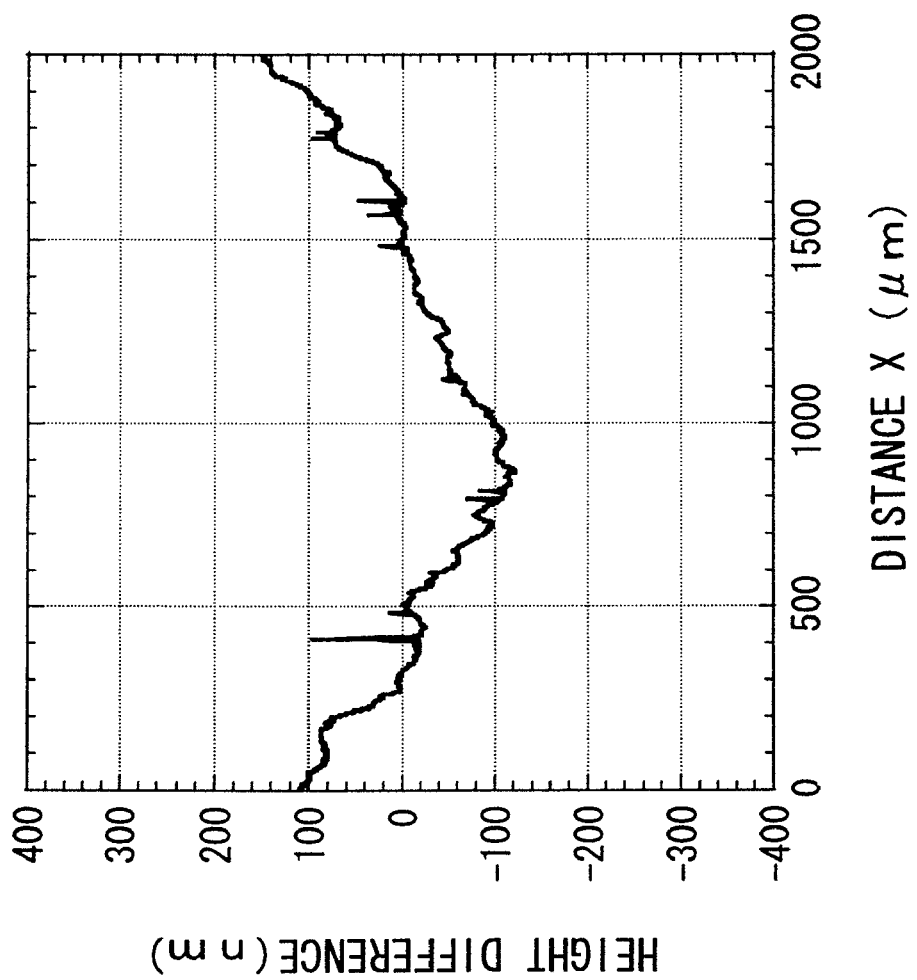
FIG. 12 is a diagram showing height variations on the surface of the nitride semiconductor.

Along the direction of arrow X shown in FIG. 10, height variations on the surface were measured by using a height difference measurement machine. The measurements were made by using the "DEKTAK3ST" model manufactured by A SUBSIDIARY OF VEECO INSTRUMENTS INC. The measurement conditions were: measurement length, 2,000 μm; measurement duration, 3 minutes; probe needle pressure, 30 mg; horizontal resolution, 1 μm per sample. FIG. 11 shows the results of measuring height variations in noncarved regions 30 μm away from carved regions. FIG. 12 shows the results of measuring height variations in noncarved regions 5 μm away from carved regions. As will be understood from FIGS. 11 and 12, whereas height variations on the surface in regions 30 μm away from carved regions were about 40 nm, those in regions 5 μm away therefrom were as large as 200 nm.

In a semiconductor laser, the laser stripe needs to be formed at a certain distance, 5 μm or more at least (preferably, 30 μm or more), to suppress variations (strains and flatness) resulting from the influence of grooves as described in connection with the related art. In such a position, lateral growth does not effectively suppress the propagation of defects from the substrate.

The purpose of forming grooves in the substrate according to the present invention is utterly different from the purpose of forming grooves in a substrate with a view to exploiting so-called lateral growth technology (for example, ELOG technology) to reduce the density of defects extending from the substrate to a crystal growth film. For the purpose of reducing the defect density, to obtain the effect of lateral growth, the intervals between the grooves are typically about equal to the film thickness of the formed layer or less, and are, even extended to the maximum, about three times the film thickness or less. In this structure, it is difficult to obtain regions where, as described above, the layer thickness is uniform in the direction parallel to the grooves. Thus, when laser stripes are formed, undesirably, the film thickness varies in the direction of the stripes.

By contrast, the grooves in the present invention are formed not for that purpose, but for the purpose of maintaining a certain degree of flatness where the laser stripe is formed while effectively preventing cracks. The intervals of the grooves are about of the same order as the width of the semiconductor laser device, specifically about 50 μm at the minimum, and preferably 100 μm or more.

Here, the description deals specifically with a semiconductor laser. It should be understood, however, that application of the present invention is not limited to this particular type of device. For example, even in a case where an electronic device such as a light-emitting diode (LED) or FET (field-emission transistor) is formed on a substrate as described in connection with this embodiment, on the same principles as those described above, it is possible to greatly reduce strains and cracks present in a nitride semiconductor film and thereby increase the yield rate. With an LED or the like, problems have been reported such as an uneven light emission pattern and lowering of light emission intensity caused by strains present in a film.

Figures 13A, 13B:
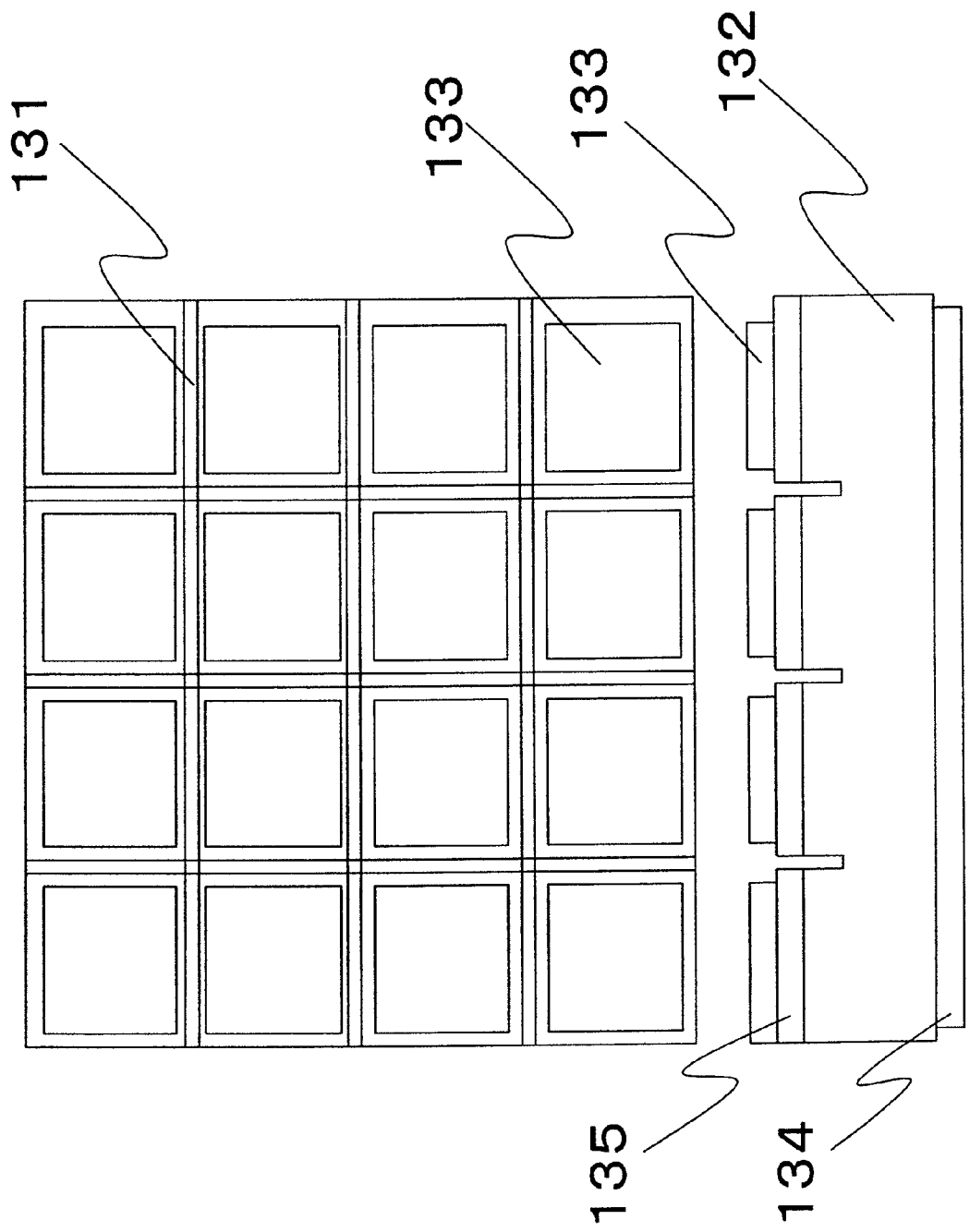
FIGS. 13A and 13B are a top view and a sectional view, respectively, schematically showing the structure of LEDs formed on the carved substrate.

In such a device, carved regions 131 may be formed in the shape of stripes that run both longitudinally and laterally so as to form a mesh-like pattern as shown in FIGS. 13A and 13B. In FIGS. 13A and 13B, reference numeral 132 represents an n-type GaN substrate, reference numeral 133 represents a p-type electrode, reference numeral 134 represents an n-type electrode, reference numeral 135 represents a nitride semiconductor thin film. When an LED was fabricated with the structure shown in FIGS. 13A and 13B, it was possible to reduce the strains present in the nitride semiconductor film, to alleviate the unevenness in the light emission pattern, and reduce cracks to zero.

Obviously, many modifications and variations of the present invention are possible in light of the above teachings. It is therefore to be understood that within the scope of the appended claims, the invention may be practiced other than as specifically described.

What is claims is:

1. A method for fabricating a nitride semiconductor laser device, comprising:
    a first step of forming a substrate whose top surface is a nitride semiconductor layer and that has a carved region and a non-carved region;
    a second step of forming, directly onto the top surface of the substrate, a nitride semiconductor film having a stripe-shaped laser light waveguide structure,
    wherein
    the top surface of the substrate has a low defect region with a defect density of $10^6$ $cm^{-2}$ or less,
    in the first step, the carved region is formed in the top surface of the substrate in the low defect region of the substrate, and the non-carved region is formed in the top surface of the substrate,
    in the second step, the nitride semiconductor film is formed above both the carved region and the non-carved region,
    in the second step, the laser light waveguide structure in the nitride semiconductor film is formed right above the non-carved region, and
    in the second step, the laser light waveguide structure in the nitride semiconductor film is formed in a region located 5 μm or more away from the nearest edge of the carved region in the top surface of the substrate.

2. A method for fabricating a nitride semiconductor light-emitting device, comprising:
    a first step of forming a substrate whose top surface is a nitride semiconductor layer and that has a carved region and a non-carved region;
    a second step of forming, directly onto the top surface of the substrate, a nitride semiconductor film having a light-emitting region,
    wherein
    the top surface of the substrate has a low defect region with a defect density of $10^6$ $cm^{-2}$ or less, in the first step, at least one carved region is formed in the top surface of the substrate in the low defect region of the substrate, and the non-carved region is formed in the top surface of the substrate, in the second step, the nitride semiconductor film is formed in contact with both the carved region and the non-carved region, in the second step, the light-emitting region in the nitride semiconductor film is formed right above the non-carved region, and in the second step, the light-emitting region in the nitride semiconductor film is formed in a region located 5 μm or more away from the nearest edge of the carved region in the top surface of the substrate.

3. A method for fabricating a nitride semiconductor laser device, comprising:

a first step of forming a substrate whose top surface is a nitride semiconductor layer and that has a carved region and a high-flatness region;

a second step of forming, directly onto the top surface of the substrate, a nitride semiconductor film having a stripe-shaped laser light waveguide structure and a depressed portion, wherein the top surface of the substrate has a low defect region with a defect density of $10^6$ cm$^{-2}$ or less, in the first step, the carved region is formed by etching in the top surface of the substrate in the low defect region of the substrate, in the second step, the nitride semiconductor film is formed on the substrate, in the second step, the depressed portion is formed only in a part of the nitride semiconductor film right above the carved region, in the second step, the laser light waveguide structure in the nitride semiconductor film is formed right above the high-flatness region, and in the second step, the laser light waveguide structure in the nitride semiconductor film is formed in a region located 5 μm or more away from the nearest edge of the carved region in the top surface of the substrate.

4. A method for fabricating a nitride semiconductor light-emitting device, comprising:

a first step of forming a substrate whose top surface is a nitride semiconductor layer and that has a carved region and a high-flatness region;

a second step of forming, directly onto the top surface of the substrate, a nitride semiconductor film having a light-emitting region and a depressed portion, wherein the top surface of the substrate has a low defect region with a defect density of $10^6$ cm$^{-2}$ or less, in the first step, the carved region is formed by etching in the top surface of the substrate in the low defect region of the substrate, in the second step, the nitride semiconductor film is formed on the substrate, in the second step, the depressed portion is formed only in a part of the nitride semiconductor film right above the carved region, in the second step, the light-emitting region in the nitride semiconductor film is formed right above the high-flatness region, and in the second step, the light-emitting region in the nitride semiconductor film is formed in a region located 5 μm or more away from the nearest edge of the carved region in the top surface of the substrate.

* * * * *